(12) United States Patent
Fu et al.

(10) Patent No.: US 11,695,434 B2
(45) Date of Patent: Jul. 4, 2023

(54) SYSTEMS AND METHODS FOR DECODING ERROR CORRECTING CODES WITH HISTORICAL DECODING INFORMATION

(71) Applicant: Innogrit Technologies Co., Ltd., Shanghai (CN)

(72) Inventors: Bo Fu, Cupertino, CA (US); Jie Chen, Milpitas, CA (US); Zining Wu, Los Altos, CA (US)

(73) Assignee: INNOGRIT TECHNOLOGIES CO., LTD., Shanghai (CN)

( * ) Notice: Subject to any disclaimer, the term of this patent is extended or adjusted under 35 U.S.C. 154(b) by 0 days.

(21) Appl. No.: 17/489,901

(22) Filed: Sep. 30, 2021

(65) Prior Publication Data

US 2022/0021403 A1   Jan. 20, 2022

Related U.S. Application Data

(63) Continuation of application No. 16/841,158, filed on Apr. 6, 2020, now Pat. No. 11,159,182.

(51) Int. Cl.
| | |
|---|---|
| *H03M 13/45* | (2006.01) |
| *H03M 13/37* | (2006.01) |
| *G06F 12/0871* | (2016.01) |
| *G06F 12/02* | (2006.01) |
| *G06F 9/30* | (2018.01) |
| *G06F 12/1045* | (2016.01) |
| *G06F 11/10* | (2006.01) |

(52) U.S. Cl.
CPC ........ *H03M 13/45* (2013.01); *G06F 9/30047* (2013.01); *G06F 11/1016* (2013.01); *G06F 12/0246* (2013.01); *G06F 12/0871* (2013.01); *G06F 12/1054* (2013.01); *H03M 13/3784* (2013.01)

(58) Field of Classification Search
CPC .......................... H03M 13/45; H03M 13/3784
See application file for complete search history.

(56) References Cited

U.S. PATENT DOCUMENTS

| | | | | |
|---|---|---|---|---|
| 5,432,803 | A  * | 7/1995 | Liu .................... | H03M 13/4169 |
| | | | | 714/787 |
| 2010/0211857 | A1* | 8/2010 | Kobayashi ......... | G11B 20/1833 |
| | | | | 714/752 |
| 2016/0306694 | A1* | 10/2016 | Tai ..................... | H03M 13/6325 |
| 2016/0344426 | A1* | 11/2016 | Bhatia ................ | H03M 13/453 |
| 2018/0076832 | A1* | 3/2018 | Haga ................... | H03M 13/458 |
| 2020/0036395 | A1* | 1/2020 | Chen ..................... | H03M 13/45 |
| 2020/0303018 | A1* | 9/2020 | Takizawa ........... | G11C 16/0483 |
| 2021/0311876 | A1* | 10/2021 | Fu ....................... | G06F 9/30047 |

* cited by examiner

*Primary Examiner* — Joseph D Torres
(74) *Attorney, Agent, or Firm* — IPro, PLLC

(57) ABSTRACT

Systems and methods are provided for decoding data read from non-volatile storage devices. A method may comprise receiving a chunk of data read from a physical location of a non-volatile storage device and searching a memory for soft information associated with the physical location using a unique identifier associated with the physical location. The soft information may be generated from one or more previous decoding processes on previous data from the physical location. The method may further comprise retrieving the soft information identified by the unique identifier associated with the physical location from the memory, decoding the chunk of data with the soft information indicating reliability of bits in the chunk of data and updating the soft information with decoding information generated during the decoding.

29 Claims, 5 Drawing Sheets

SYSTEMS AND METHODS FOR DECODING ERROR CORRECTING CODES WITH HISTORICAL DECODING INFORMATION

TECHNICAL FIELD

The disclosure herein relates to decoding data encoded with parity check data, particularly relates to decoding encoded data using historical information collected from previous decoding operations.

BACKGROUND

One issue common to many data communication or storage systems is the corruption of data, for example, by noise in a communication channel or write/read processes in a storage system. One technique to remedy the data corruption is to use an error-correcting code (ECC) or forward error correction (FEC) code. Both ECC and FEC add redundant data or parity data to user data such that user data can be recovered by a receiver or reader even when a number of errors (up to the capability of the code being used) were introduced, for example, during the process of transmission or corruption on a storage.

A lot of different coding schemes have been developed over the years, for example, Hamming codes, Reed-Solomon codes, Turbo codes, etc. More recently, low density parity check (LDPC) codes have become widely used. All these codes, however, are computation complex and the techniques for using these codes are still in need of improvements.

SUMMARY

Disclosed herein may include a method that may comprise receiving a chunk of data read from a physical location of a non-volatile storage device and searching a memory for soft information associated with the physical location using a unique identifier associated with the physical location. The soft information may be generated from one or more previous decoding processes on data from the physical location. The method may further comprise retrieving the soft information identified by the unique identifier associated with the physical location from the memory, decoding the chunk of data with the soft information indicating reliability of bits in the chunk of data and updating the soft information with decoding information generated during the decoding.

According to an embodiment, the chunk of data may be a block of data and the unique identifier associated with the physical location may be a physical data block address (PDA) for the block.

According to an embodiment, the soft information may include reliability information for each bit respectively, the reliability information may be generated based on whether and how often a respective bit has been flipped in the one or more previous decoding processes.

According to an embodiment, the soft information may include reliability information for the chunk of data as a whole.

According to an embodiment, the reliability information for the chunk of data as a whole may include one logic state being more reliable than another logic state.

According to an embodiment, the memory may store the soft information using the unique identifier associated with the physical location as an index.

According to an embodiment, the method may further comprise caching the soft information with a caching algorithm.

Embodiments may also include a storage system controller, which may comprise: a decoder, a soft information fetcher and a soft information generator. The decoder may be configured to receive a chunk of data read from a physical location of a non-volatile storage device and decode the chunk of data. The soft information fetcher may be configured to search a memory for soft information associated with the physical location using a unique identifier associated with the physical location and retrieve the soft information identified by the unique identifier associated with the physical location from the memory. The soft information may be generated from one or more previous decoding processes on data from the physical location and the decoder may be further configured to decode the chunk of data with the soft information indicating reliability of bits in the chunk of data. The soft information generator may be configured to update the soft information with decoding information generated by the decoder during decoding the chunk of data.

Disclosed herein may also include a non-transitory machine-readable medium having executable instructions, wherein the executable instructions, when executed by a storage controller, causes the storage controller to receive a chunk of data read from a physical location of a non-volatile storage device, search a memory for soft information associated with the physical location using a unique identifier associated with the physical location, retrieve the soft information identified by the unique identifier associated with the physical location from the memory, decode the chunk of data with the soft information indicating reliability of bits in the chunk of data and update the soft information with decoding information generated during the decoding. The soft information may be generated from one or more previous decoding processes on data from the physical location.

DETAILED DESCRIPTION

Figure 1:
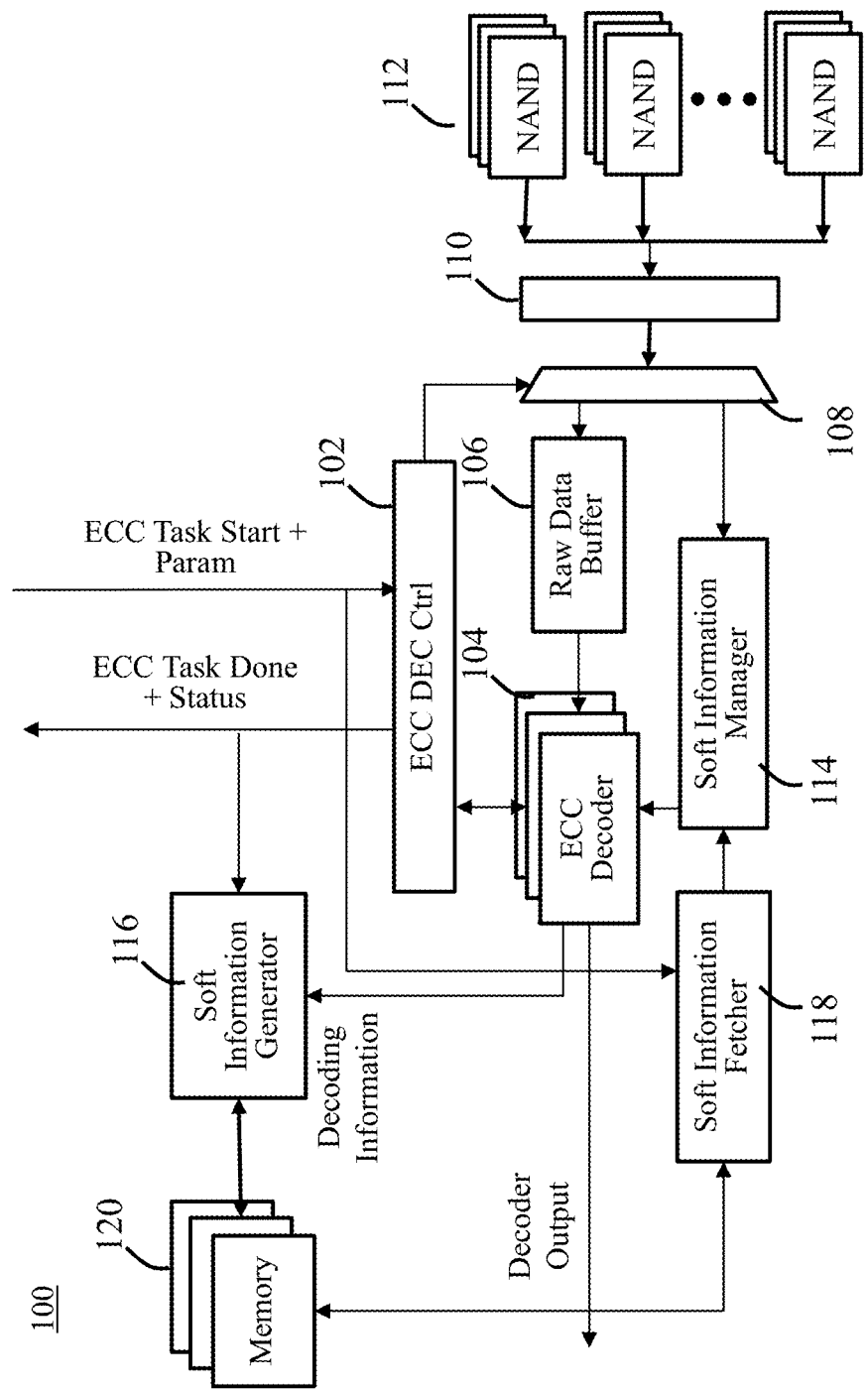
FIG. 1 schematically shows a non-volatile storage system in accordance with an embodiment of the present disclosure.

Specific embodiments according to the present disclosure will now be described in detail with reference to the accompanying figures. Like elements in the various figures are denoted by like reference numerals for consistency.

The present disclosure provides apparatuses, systems and methods for decoding data stored in non-volatile memory (NVM) storage devices that are encoded with an error-correcting code (ECC). FIG. 1 schematically shows a non-volatile storage system 100 in accordance with an embodiment of the present disclosure. The non-volatile storage system 100 may comprise an ECC Decoding Controller 102, one or more ECC decoders 104, a raw data buffer 106, an ECC data interface 108, a NAND interface controller 110, a plurality of NAND devices 112, a soft information manager 114, a soft information generator 116, a soft information fetcher 118 and a memory 120. The plurality of NAND devices 112 may be coupled to the NAND interface controller 110 via one or more channels. In one embodiment, a channel may comprise more than one NAND device. The raw data buffer 106 may comprise one or more buffer modules and the memory 120 also may comprise one or more memory modules.

In various embodiments, the one or more ECC decoders 104 may include decoder circuitry for hard decision decoding and soft decision decoding. For example, the ECC decoders 104 may comprise one or more hard decision decoders and one or more soft decision decoders. The decoder circuitry for hard decision decoding may be any suitable hard decision decoder that implements a hard decision algorithm, including but not limited to, a bit flipping algorithm or any other hard decision technique yet to be developed. And the decoder circuitry for soft decision decoding may be any suitable soft decision decoder that implements a soft decision algorithm, including but not limited to, any conventional soft decision algorithm based on belief propagation known in the industry (e.g., sum-product algorithm ("SPA"), min-sum algorithm, stochastic decoding algorithm, or their variations) or any other soft decision algorithms yet to be developed. For example, in one embodiment, the one or more ECC decoders 104 may include a min-sum decoder, which can operate in a single-bit hard decision (HD) mode and a multiple-bit information soft decision (SD) mode. In one embodiment, the soft information fetched from the memory 120 may be used by the decoder circuitry for soft decision decoding at the one or more ECC decoders 104.

It should be noted that other soft information, such as the conventional soft information obtained by reading the same data from the NAND devices multiple times may also be obtained from the NAND devices and used by the soft decision decoding in some embodiments. For example, in one embodiment, if soft information cannot be fetched from the memory 120, conventional soft information may be obtained from the NAND devices and sent to the soft information manager 114. The soft information manager 114 may forward the conventional soft information to the decoder circuitry for soft decision decoding at the one or more ECC decoders 104.

In one embodiment, the non-volatile storage system 100 may be a solid-state drive (SSD). Moreover, in one embodiment, the ECC Decoding Controller 102, the one or more ECC decoders 104, the raw data buffer 106, the ECC data interface 108, the soft information manager 114, the soft information generator 116, the soft information fetcher 118 and the NAND interface controller 110 may be integrated in one storage system controller chip (e.g., an integrated circuit (IC) chip), while the memory 120 and the plurality of NAND devices 112 may be coupled to the storage system controller chip. In another embodiment, the memory 120 may also be integrated into the chip of the storage system controller.

ECC Decoding Controller 102 may be a central processing unit (CPU), a graphics processing unit (GPU), a field-programmable gate array (FPGA), or an Application Specific IC (ASIC). In some embodiments, when performing a read operation, the ECC Decoding Controller 102 may receive an ECC Task Start signal with one or more parameters. The ECC Decoding Controller 102 may send a signal to the ECC data interface 108 for the ECC data interface 108 to put one or more chunks of data received from the NAND devices 112 into the raw data buffer 106. It should be noted that the term "chunk" used herein may refer to a piece of data that has a certain size and is stored in the storage system 100 such that the physical location of the piece of data in the storage system 100 may be associated with a unique identifier. In one embodiment, the chunk may be a data block, which may include one or more ECC codewords, and the physical location of the chunk may be uniquely identified by its physical data block address (PDA).

The one or more ECC decoders 104 may decode each chunk of data obtained from the NAND devices 112. During or after the decoding operation, decoding information may be generated and sent to the soft information generator 116. For example, during a decoding operation, some bits may be flipped and some are not. This may be useful decoding information. The soft information generator 116 may receive a signal from the ECC Decoding Controller 102 indicating that the ECC decoding task is done and generate soft information for a corresponding chunk from the decoding information. The generated soft information may be saved in the memory 120. In some embodiments, the soft information generated at the soft information generator 116 may indicate reliability of each bit in a corresponding chunk. For example, a chunk of data may contain many bits and a decoding operation may change bit values for some bits but not all bits. It may be assumed that those bits with values changed during an ECC decoding operation may be prone to be erroneous, and thus they may be marked as less reliable compared to other bits that have not changed their values during the decoding operation.

Decoding information may be generated at the one or more ECC decoders 104 each time the one or more ECC decoders 104 decodes a chunk of data from a particular location of the NAND devices 112. In some embodiments, the soft information generator 116 may retrieve the generated soft information from the memory 120 and update the soft information using newly generated decoding information each time a chunk of data from the particular chunk of NAND devices 112 is decoded by the one or more ECC decoders 104. Thus, the soft information stored in the memory 120 may be cumulative, and referred to as historical information. For example, after performing a few decoding operations on data from one physical location, the soft information may show that, historically, some bits may have their values changed more often than others and some bits may never change their values. The soft information may thus indicate reliability of the bits from this physical location accordingly in a spectrum such that those bits with values changed most often as most unreliable and those bits with values never changed as most reliable.

The soft information may be used for a future decoding process when the data chunk from the same physical location of NAND devices 112 is read and updated by each future decoding process of data from the same location. It should be noted that the soft information may be generated by hardware or software. In various embodiments, the soft information generator 116 may be implemented in hardware or software. For example, in one embodiment, the soft information generator 116 may be implemented as software executed in a processor.

The memory 120 used to store soft information may be Static Random-Access Memory (SRAM), Double Data Rate RAM, or MRAM or any storage that may have a much shorter read latency than NAND device. Therefore, compared to a conventional approach of obtaining soft information from the NAND devices, for example, by rereading chunk of data from the NAND devices, embodiments may be much faster to obtain the soft information from the memory 120. Moreover, in at least one embodiment, fetching the soft information from the memory 120 and reading the raw data from NAND device may be executed at the same time, because they are coming from different paths and these actions may be performed in parallel. For example, when the NAND interface controller 110 receive a signal to start reading data from a physical location of the NAND devices 112, the ECC Decoding Controller 102 may send a signal to the soft information fetcher 118 to start search and retrieve soft information associated with the physical location. The parallelism may help to avoid the overhead of reading any soft information from the NAND devices.

Figure 2B:
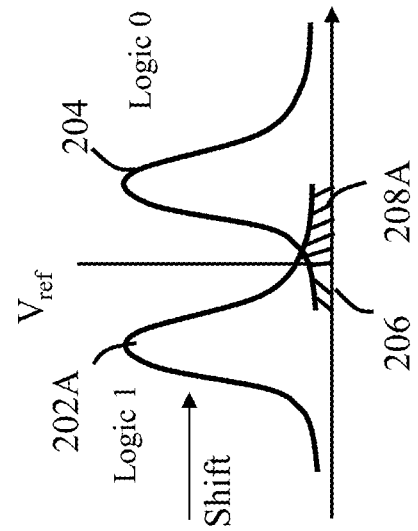
FIG. 2A, FIG. 2B and FIG. 2C schematically show the effect of shift of the threshold voltage values of NAND flash memory cells in accordance with an embodiment of the present disclosure.
Figure 2A:
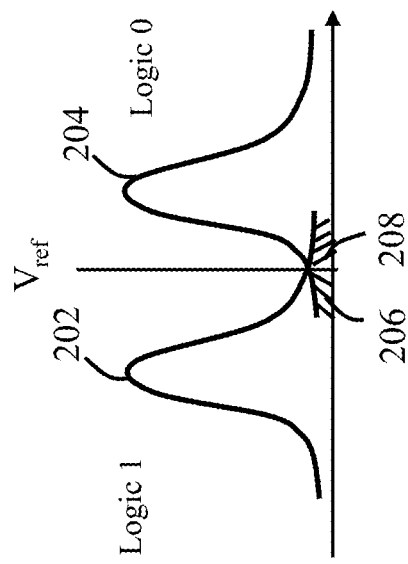
Figure 2C:
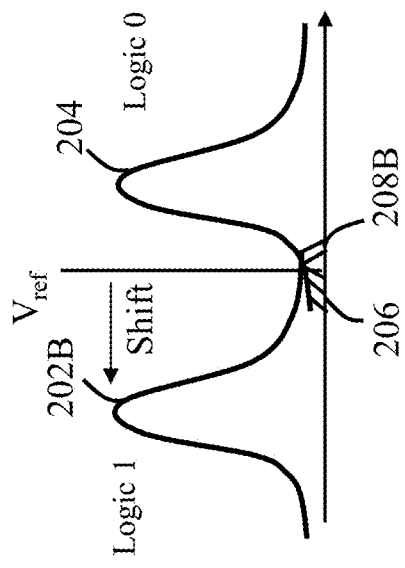

In various embodiments, the soft information generated from historical decoding information may be applied to a whole data chunk or each bit of the data chunk respectively in a future decoding process. FIG. 2A, FIG. 2B and FIG. 2C schematically show the effect of shifting the threshold voltage values of NAND flash memory cells and how the soft information from historical decoding information may be applied to a whole data chunk in accordance with an embodiment of the present disclosure. The horizontal axis in FIG. 2A, FIG. 2B and FIG. 2C may be the threshold voltage of storage cells in a NAND device. The vertical axis in FIG. 2A, FIG. 2B and FIG. 2C may be the probability distribution function of the threshold voltages of storage cells.

The curve 202 in FIG. 2A may indicate readout of a first logic state, for example, logic one. The curve 204 in FIG. 2A may indicate readout of a second logic state, for example, logic zero. Readout used herein may refer to any given cell's readout voltage and any given bit may be assigned a logic state by comparing this readout voltage to the reference voltage $V_{ref}$.

As shown in FIG. 2A, the curve 202 may have a tail portion 208 extending past the reference voltage $V_{ref}$ into the territory that may be regarded as in the second logic state, and the curve 204 may have a tail portion 206 extending past the reference voltage $V_{ref}$ into the territory that may be regarded as in the first logic state. That is, the correct logic state for bits with their readout in the tail portion 206 may be the second logic state but because these bits' threshold voltages are smaller than the reference voltage $V_{ref}$ they may be regarded as the first logic state. At the same time, the correct logic state for bits with their readout in the tail portion 208 may be the first logic state but because these bits' threshold voltages are larger than the reference voltage $V_{ref}$ they may be regarded as the second logic state.

In embodiments, during a decoding process, the incorrectly labeled bits may be corrected. That is, during a decoding process, the bits with readouts in the portion 206 that may be incorrectly labeled as logic state one may be flipped to logic state two and bits with readouts in the portion 208 that may be incorrectly labeled as logic state two may be flipped to logic state one. When the threshold voltage is not shifted, as in FIG. 2A, the sizes of the tail portions 206 and 208 may be close and the number of corrections from logic state one to logic state two may be close to the number of corrections from logic state two to logic state one.

In various embodiments, the threshold voltages of cells may shift. For example, with the increase of use (e.g., increased P/E cycles), threshold voltages of cells may tend to shift to the right. That is, the reference voltage $V_{ref}$ may not be in a good position in which the sizes of the tail portions 206 and 208 are close. FIG. 2B shows that the threshold voltages for the logic state one may be shifted to the right a little bit thus the curve 202 of FIG. 2A becomes the curve 202A in FIG. 2B. The right shift of the threshold voltages for the logic state one may cause the tail portion 208 of FIG. 2A become the tail portion 208A in FIG. 2B. Because the shift of the curve 202A is to the right, the tail portion 208A may be larger than the tail portion 208 and thus the tail portion 208A may be larger than the tail portion 206 in FIG. 2B. That is, there may be more bits with their readout voltages in the tail portion 208A than the number of bits in the tail portion 206 of FIG. 2B.

The effect of the threshold voltage shift is that there may be unbalanced corrections between the two logic states. In at least one embodiments, two flipping counters may be use. One flipping counter may record how many bits are flipped from the first logic state to the second logic state (e.g., "1" to "0") and another flipping counter may record how many bits are flipped from the second logic state to the first logic state (e.g., "0" to "1") during one decoding process for one chunk of data. The difference between the counts of the two flipping counters may provide extra information about a NAND device, which may be used to improve ECC decoding performance.

For example, in FIG. 2B the threshold voltages for logic state one may be shifted higher and the flipping count for logic state two (e.g., logic 0) to logic state one (e.g., logic 1) flipping may be greater than the flipping count for logic state one (e.g., logic 1) to logic state two (e.g., logic 0) flipping. Based on the difference between the flipping counts, bits with readout values to be logic state one and bits with readout values to be logic state two may be given different reliable levels. For example, for data from a physical location, if the soft information indicates that there are more flips from logic state one to logic state two (e.g., logic 1 to 0 flip) than from logic state two to logic state one (e.g., logic 0 to 1 flip), then the logic state two may be reliable and a bit with a readout value in logic state two (e.g., logic 0) may be more reliable than a bit with a readout value in logic state one (e.g., logic 1).

It should be noted that FIG. 2B shows an example of the threshold voltages of the logic state one being shifted larger. FIG. 2C shows another example of the threshold voltages of the logic state one being shifted left (e.g., become smaller) thus the curve 202 of FIG. 2A becomes the curve 202B in FIG. 2C. The left shift of the threshold voltages for the logic state one may cause the tail portion 208 of FIG. 2A become the tail portion 208B in FIG. 2C. Because the shift of the curve 202B is to the left, the tail portion 208B may be smaller than the tail portion 208 and thus the tail portion 208B may be smaller than the tail portion 206 in FIG. 2C. That is, there may be less bits with their readout voltages in the tail portion 208B than the number of bits in the tail portion 206 of FIG. 2C.

Because in FIG. 2C, the threshold voltages for logic state one are shifted lower, the flipping count for logic state two (e.g., logic 0) to logic state one (e.g., logic 1) flipping may be smaller than the flipping count for logic state one (e.g., logic 1) to logic state two (e.g., logic 0) flipping. In the example of FIG. 2C, a bit with a readout value in logic state two (e.g., logic 0) may be more reliable than a bit with a readout value in logic state one (e.g., logic 1).

It should be noted that the threshold voltage shifting in FIG. 2B and FIG. 2C are examples for illustration only. In some other embodiments, the threshold voltages for the logic state two may also shift left or right. Moreover, the shapes of the curves 202 and 204 may change during a shift, for example, the curves 202 and/or 204 may become lower, wider, or both.

Figure 3:
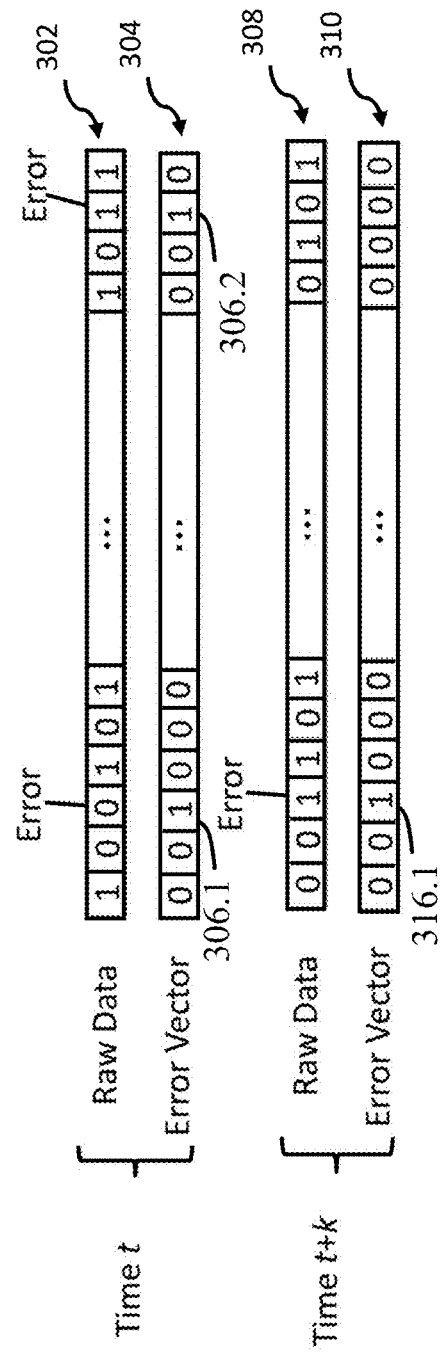
FIG. 3 schematically shows historical information on individual bits in accordance with an embodiment of the present disclosure.

FIG. 3 schematically shows historical information on individual bits in accordance with an embodiment of the present disclosure. At time t, a chunk of data 302 from a physical location of the NAND devices 112 may be decoded. A plurality of errors may be corrected during the decoding process and a vector 304 may be generated with marks indicating which bit(s) of the chunk of data 302 may be flipped. In one embodiment, the vector 304 may have the same size as the chunk of data 302 and the marks may be "one" in positions 306.1 and 306.2 of the vector 304 that correspond to the positions of bits in the chunk of data 302 that have been flipped.

At time t+k, a chunk of data 308 from the same location of the NAND devices 112 may be decoded. The information from the previous decoding at time t may be used, which may show that the bits at positions 306.1 and 306.2 may be less reliable than others. A plurality of errors may be corrected during the decoding process at time t+k and a vector 310 may be generated with marks indicating which bit(s) of the chunk of data 308 may be flipped. The vector 310 may have "one" in position 306.1 in the vector 310 that may match the position of the bit in the chunk of data 308 that has been flipped. In one embodiment, the vector 310 may be an updated version of the vector 304 after the vector 304 is updated with the new decoding operation at time t+k. In some embodiments, the vector (e.g., 304 and 310) may be referred to as an error vector.

It should be noted that although FIG. 3 shows two errors being corrected at time t and one error being corrected at time t+k, in general, there may be many bits of one chunk of data being corrected by one decoding operation. Moreover, the soft information may indicate that various bits of a chunk of data may have different levels of reliability and the reliability for each bit may change over time. For example, the bit at position 306.1 may be less reliable than the bit at position 306.2 based on historical information, and the bit at position 306.2 may be less reliable than other bits that never have any errors found by the decoding process at time t and time t+k.

Figure 4:
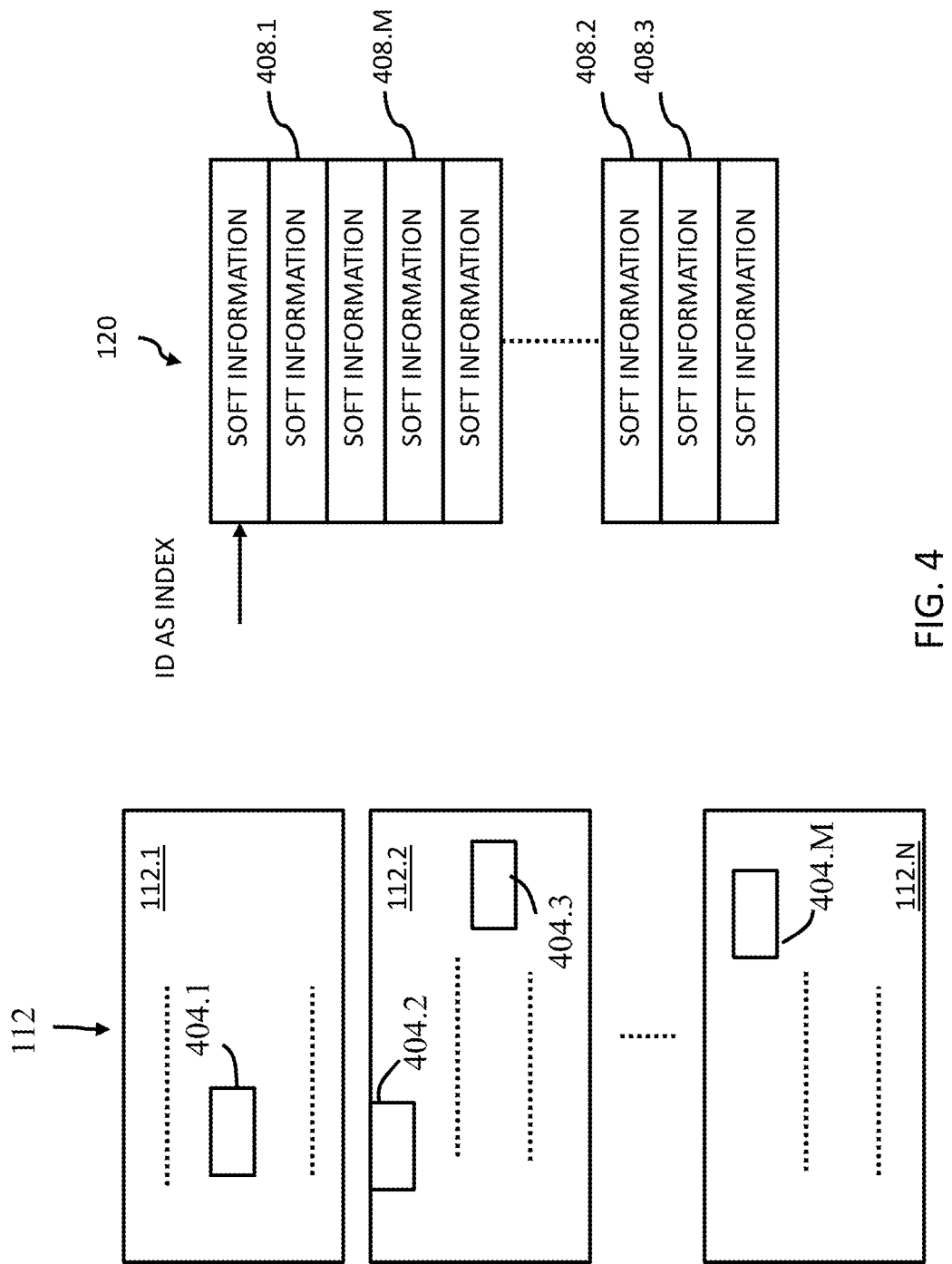
FIG. 4 schematically shows how historical information is stored in a memory in accordance with an embodiment of the present disclosure.

FIG. 4 schematically shows how soft information may be stored in the memory 120 in accordance with an embodiment of the present disclosure. In an embodiment, the memory 120 may keep the soft information for different memory locations using a unique identifier as an index. As shown in FIG. 4, the NAND devices 112 may comprise NAND devices 112.1 through 112.N with N being a positive integer larger than one. Each storage location may be associated with a unique identifier and the unique identifier may be used as an index for the soft information stored in the memory 120. For example, the NAND device 112.1 may have a chunk of data stored at the location 404.1, the NAND device 112.2 may have a chunk of data stored at the location 404.2 and another chunk of data stored at the location 404.3, and the NAND device 112.N may have a chunk of data stored at the location 404.M with M larger than three. The storage location may refer to an identifiable unit of a NAND device with a size of a specific size. In an embodiment, the physical location may be a physical location of a data block and the unique identifier may be its physical data block address (PDA).

In the memory 120, soft information for data stored at the location 404.1 may be kept at 408.1 and associated with an index value, which may be the unique identifier associated with the location 404.1. Soft information for data stored at the location 404.2 may be kept at 408.2 and associated with another index value, which may be the unique identifier associated with the location 404.2. Soft information for data stored at the location 404.3 may be kept at 408.3 and associated with its own index value, which may be the unique identifier associated with the location 404.3. Similarly, soft information for data stored at the location 404.M may be kept at 408.M and associated with its own index value, which may be the unique identifier associated with the location 404.M.

In some embodiments, due to size limit, the memory 120 may not be able to hold soft information for all storage locations of the NAND devices 112. That is, if a lot of physical locations' soft information need to be saved, the required memory size may exceed the size of the memory 120. In some embodiments, a caching approach may be used. For example, instead of saving soft information for all NAND storage locations, soft information for a subset of NAND storage locations (e.g., a number of T locations) may be kept in the memory 120. There are various ways to choose the T storage locations. Any existing or future developed caching algorithms may be used. For example, these T storage locations may be storage locations most recently read or most recently have errors. In an embodiment that only soft information for a subset of storage locations are saved, the memory 120 may also store the unique identifiers for these storage locations.

Figure 5:
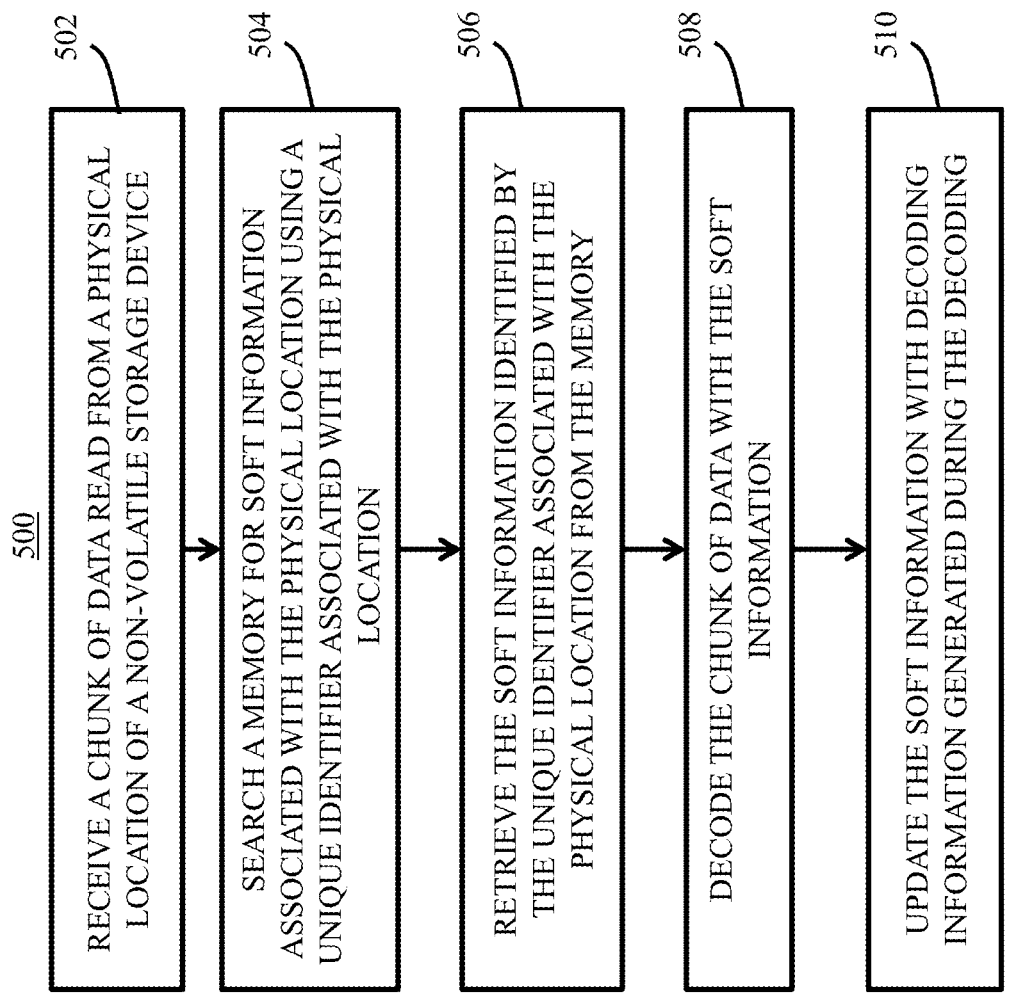
FIG. 5 is a flow diagram of a process for decoding a chunk of data in accordance with an embodiment of the present disclosure.

FIG. 5 is a flow chart for a process 500 to decode a chunk of data using soft information from historical decoding information according to an embodiment. In block 502, a chunk of data read from a physical location of a non-volatile storage device may be received. For example, the one or more ECC decoders 104 may receive a chunk of data from the NAND devices 112. In block 504, a memory may be searched for soft information associated with the physical location using a unique identifier associated with the physical location. In one embodiment, for example, the soft information may be generated from one or more previous decoding processes on previous data from the physical location and stored in a memory (e.g., memory 120). In block 506, the soft information identified by the unique identifier associated with the physical location may be retrieved from the memory. In one embodiment, for example, the soft information fetcher 118 may be configured to search the memory 120 for the soft information associated with the physical location using a unique identifier associated with the physical location and retrieve the identified soft information from the memory 120.

In block 508, the chunk of data may be decoded using the soft information indicating reliability of bits in the chunk of data. In one embodiment, the one or more ECC decoders 104 may include at least one decoder that is configured to use soft information retrieved from the memory 120 that may indicate reliability of bits in a chunk of data to decode the chunk. In block 510, the soft information may be updated with decoding information generated during the decoding. In one embodiment, the soft information may be initially generated by the soft information generator 116 when a chunk of data is read from a physical location and no soft information associated with this physical location is found in the memory 120. Afterwards, the soft information may be updated by the soft information generator 116 each time a chunk of data from the same physical location is decoded. The updated soft information may be put back into the memory 120 for future decoding of data from the same physical location.

Embodiments of the processes disclosed herein (including the process 500) may be implemented using software (e.g., executable by a computer processor (e.g., a central processing unit (CPU), a graphics processing unit (GPU), or both)), hardware (e.g., a field-programmable gate array (FPGA) or an application-specific IC (ASIC), firmware, or any suitable combination of the three.

In one embodiment, for example, some or all of the disclosed methods and operations may be implemented in software comprising computer-executable instructions stored on one or more computer-readable storage media. The one or more computer-readable storage media may include non-transitory computer-readable media (such as removable or non-removable magnetic disks, magnetic tapes or cassettes, solid state drives (SSDs), hybrid hard drives, CD-ROMs, CD-RWs, DVDs, or any other tangible storage medium), volatile memory components (such as DRAM or SRAM), or nonvolatile memory components (such as hard drives)). The computer-executable instructions may be executed on a computer (e.g., any commercially available computer, including smart phones or other mobile devices that include computing hardware) by a computer processor (e.g., a CPU, a GPU, or both). Any of the computer-executable instructions for implementing the disclosed techniques as well as any data created and used during implementation of the disclosed embodiments may be stored on one or more computer-readable media (e.g., non-transitory computer-readable media). Such software can be executed, for example, on a single local computing device (e.g., any suitable commercially available computer or mobile device) or in a network environment (e.g., via the Internet, a wide-area network, a local-area network, a client-server network (such as a cloud computing network), or other such network) using one or more network computers.

Embodiments according to the present disclosure, may be implemented for any types of ECC codes, such as, but not limited to, rectangular parity, LDPC and Hamming code.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A method, comprising:
   receiving a first chunk of data read from a physical location of a non-volatile storage device;
   searching a memory for soft information associated with the physical location using a unique identifier associated with the physical location;
   retrieving the soft information identified by the unique identifier associated with the physical location from the memory;
   decoding the first chunk of data with the soft information indicating reliability of bits in the first chunk of data; and
   generating updated soft information associated with the physical location using the soft information and decoding information generated during the decoding of the first chunk of data, and storing the updated soft information in the memory.

2. The method of claim 1, wherein the soft information is generated from one or more previous decoding processes on previous data from the physical location.

3. The method of claim 2, wherein the soft information includes reliability information for each bit respectively, the reliability information is generated based on whether and how often a respective bit has been flipped in the one or more previous decoding processes.

4. The method of claim 1, the first chunk of data is a block of data and the unique identifier associated with the physical location is a physical data block address (PDA) for the block.

5. The method of claim 1, wherein the soft information includes reliability information for the first chunk of data as a whole.

6. The method of claim 5, wherein the reliability information for the first chunk of data as a whole includes one logic state being more reliable than another logic state.

7. The method of claim 1, wherein the memory stores the soft information using the unique identifier associated with the physical location as an index.

8. The method of claim 1, further comprising:
   receiving a second chunk of data read from the physical location;
   retrieving the update soft information from the memory;
   decoding the second chunk of data with the updated soft information.

9. The method of claim 1, wherein the decoding information includes whether each bit in the first chunk of data is flipped during the decoding of the first chunk of data.

10. The method of claim 1, wherein the decoding information includes a number of bits in the first chunk of data that are flipped from a first logic state to a second logic state during the decoding of the first chunk of data and a number of bits in the first chunk of data that are flipped from the second logic state to the first logic state during the decoding of the first chunk of data.

11. A storage system controller, comprising:
   a decoder configured to receive a first chunk of data read from a physical location of a non-volatile storage device and decode the first chunk of data;
   a soft information fetcher configured to:
      search a memory for soft information associated with the physical location using a unique identifier associated with the physical location; and
      retrieve the soft information identified by the unique identifier associated with the physical location from the memory, wherein the decoder is further configured to decode the first chunk of data with the soft information indicating reliability of bits in the first chunk of data; and
   a soft information generator configured to generate updated soft information associated with the physical location using the soft information and decoding information generated by the decoder during decoding the first chunk of data and configured to store the updated soft information in the memory.

12. The storage system controller of claim 11, wherein the soft information is generated from one or more previous decoding processes on previous data from the physical location.

13. The storage system controller of claim 12, wherein the soft information includes reliability information for each bit respectively, the reliability information is generated based on whether and how often a respective bit has been flipped in the one or more previous decoding processes.

14. The storage system controller of claim 11, wherein the first chunk of data is a block of data and the unique identifier associated with the physical location is a physical data block address (PDA) for the block.

15. The storage system controller of claim 11, wherein the soft information includes reliability information for the first chunk of data as a whole.

16. The storage system controller of claim 15, wherein the reliability information for the first chunk of data as a whole includes one logic state being more reliable than another logic state.

17. The storage system controller of claim 11, wherein the memory stores the soft information using the unique identifier associated with the physical location as an index.

18. The storage system controller of claim 11, wherein the decoder is configured to receive a second chunk of data read from the physical location; wherein the soft information fetcher is configured to retrieve the update soft information from the memory; wherein the decoder is further configured to decode the second chunk of data with the updated soft information.

19. The storage system controller of claim 11, wherein the decoding information includes whether each bit in the first chunk of data is flipped by the decoder during decoding the first chunk of data.

20. The storage system controller of claim 11, wherein the decoding information includes a number of bits in the first chunk of data that are flipped from a first logic state to a second logic state during the decoding of the first chunk of data and a number of bits in the first chunk of data that are flipped from the second logic state to the first logic state during the decoding of the first chunk of data.

21. A non-transitory machine-readable medium having executable instructions, wherein the executable instructions, when executed by a storage controller, causes the storage controller to:
   receive a first chunk of data read from a physical location of a non-volatile storage device;
   search a memory for soft information associated with the physical location using a unique identifier associated with the physical location;
   retrieve the soft information identified by the unique identifier associated with the physical location from the memory;
   decode the first chunk of data with the soft information indicating reliability of bits in the first chunk of data;
   generate updated soft information associated with the physical location using the soft information and decoding information generated during the decoding of the first chunk of data and store the updated soft information in the memory.

22. The non-transitory machine-readable medium of claim 21, wherein the soft information being generated from one or more previous decoding processes on previous data from the physical location.

23. The non-transitory machine-readable medium of claim 22, wherein the soft information includes reliability information for each bit respectively, the reliability information is generated based on whether and how often a respective bit has been flipped in the one or more previous decoding processes.

24. The non-transitory machine-readable medium of claim 21, wherein the first chunk of data is a block of data and the unique identifier associated with the physical location is a physical data block address (PDA) for the block, the memory stores the soft information using the PDA as an index and with a caching algorithm.

25. The non-transitory machine-readable medium of claim 24, wherein the reliability information for the first chunk of data as a whole includes one logic state being more reliable than another logic state.

26. The non-transitory machine-readable medium of claim 21, wherein the soft information includes reliability information for the first chunk of data as a whole.

27. The non-transitory machine-readable medium of claim 21, wherein the executable instructions, when executed by the storage controller, causes the storage controller to:
   receive a second chunk of data read from the physical location;
   retrieve the update soft information from the memory;
   decode the second chunk of data with the updated soft information.

28. The non-transitory machine-readable medium of claim 21, wherein the decoding information includes whether each bit in the first chunk of data is flipped during the decoding of the first chunk of data.

29. The non-transitory machine-readable medium of claim 21, wherein the decoding information includes a number of bits in the first chunk of data that are flipped from a first logic state to a second logic state during the decoding of the first chunk of data and a number of bits in the first chunk of data that are flipped from the second logic state to the first logic state during the decoding of the first chunk of data.

* * * * *